(12) United States Patent
Williams et al.

(10) Patent No.: US 9,013,209 B1
(45) Date of Patent: Apr. 21, 2015

(54) PROGRAMMABLE INPUT/OUTPUT CIRCUIT

(71) Applicant: Cypress Semiconductor Corporation, San Jose, CA (US)

(72) Inventors: Timothy John Williams, Bellevue, WA (US); David G. Wright, Woodinville, WA (US); Gregory John Verge, Lynnwood, WA (US); Bruce E. Byrkett, Preston, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/054,657

(22) Filed: Oct. 15, 2013

Related U.S. Application Data (63) Continuation of application No. 13/427,264, filed on Mar. 22, 2012, now Pat. No. 8,558,578, which is a continuation of application No. 12/753,657, filed on Apr. 2, 2010, now Pat. No. 8,179,161.

(60) Provisional application No. 61/176,933, filed on May 10, 2009, provisional application No. 61/175,856, filed on May 6, 2009, provisional application No. 61/175,586, filed on May 5, 2009.

(51) Int. Cl.
*H03K 19/0175* (2006.01)
*G06F 5/06* (2006.01)
*G06F 13/40* (2006.01)

(52) U.S. Cl.
CPC ............ *G06F 5/065* (2013.01); *G06F 13/4072* (2013.01)

(58) Field of Classification Search
CPC .................. H03K 19/0175; H03K 19/017509; H03K 19/017545; G06F 13/4072
USPC .......... 326/82–83, 86; 327/108–109; 710/302
See application file for complete search history.

(56) References Cited

U.S. PATENT DOCUMENTS

| | | | |
|---|---|---|---|
| 4,771,285 A | 9/1988 | Agrawal et al. | |
| 5,412,261 A | 5/1995 | Whitten | |
| 5,424,589 A | 6/1995 | Dobbelaere et al. | |
| 5,481,471 A | 1/1996 | Naglestad et al. | |
| 5,528,172 A | 6/1996 | Sundstrom | |
| 5,563,526 A | 10/1996 | Hastings et al. | |
| 5,598,408 A | 1/1997 | Nickolls et al. | |
| 5,604,450 A * | 2/1997 | Borkar et al. | 326/82 |
| 5,625,301 A | 4/1997 | Plants et al. | |
| 5,635,745 A | 6/1997 | Hoeld | |
| 5,671,432 A | 9/1997 | Bertolet et al. | |

(Continued)

FOREIGN PATENT DOCUMENTS

| | | |
|---|---|---|
| EP | 0871223 A | 10/1998 |
| EP | 1713252 A | 10/2006 |

OTHER PUBLICATIONS

USPTO Final Office Action for U.S. Appl. No. 12/773,801 dated Jan. 23, 2013; 13 pages.

(Continued)

*Primary Examiner* — Jason M Crawford (57) ABSTRACT

A apparatus, having a processing system and an input buffer coupled with both the processing system and one of two IO pads, and a reference buffer coupled to both the input buffer and the second of the IO pads such that the reference generator controls the input threshold of the input buffer in response to an analog voltage received from an external circuit on the second of the IO pads.

20 Claims, 11 Drawing Sheets

(56) References Cited

U.S. PATENT DOCUMENTS

| | | | |
|---|---|---|---|
| 5,748,875 A | 5/1998 | Tzori | |
| 5,754,826 A | 5/1998 | Gamal et al. | |
| 5,877,633 A * | 3/1999 | Ng et al. | 326/80 |
| 5,894,565 A | 4/1999 | Furtek et al. | |
| 5,966,047 A | 10/1999 | Anderson et al. | |
| 6,072,334 A * | 6/2000 | Chang | 326/82 |
| 6,188,381 B1 | 2/2001 | Van Der et al. | |
| 6,246,259 B1 | 6/2001 | Zaliznyak et al. | |
| 6,362,649 B1 | 3/2002 | Mcgowan | |
| 6,424,175 B1 * | 7/2002 | Vangal et al. | 326/82 |
| 6,453,422 B1 * | 9/2002 | Dabral et al. | 713/300 |
| 6,460,172 B1 | 10/2002 | Insenser Farre et al. | |
| 6,583,652 B1 | 6/2003 | Klein et al. | |
| 6,639,426 B2 * | 10/2003 | Haycock et al. | 326/82 |
| 6,717,436 B2 | 4/2004 | Kress et al. | |
| 6,724,220 B1 | 4/2004 | Snyder et al. | |
| 6,735,706 B2 | 5/2004 | Tomlinson et al. | |
| 6,738,415 B2 * | 5/2004 | Drost et al. | 375/219 |
| 6,762,632 B1 | 7/2004 | Himpe et al. | |
| 6,791,356 B2 * | 9/2004 | Haycock et al. | 326/82 |
| 6,809,572 B2 | 10/2004 | Yi et al. | |
| 6,833,732 B2 | 12/2004 | Hwang et al. | |
| 6,895,530 B2 | 5/2005 | Moyer et al. | |
| 6,971,004 B1 | 11/2005 | Pleis et al. | |
| 6,972,597 B2 * | 12/2005 | Kim | 326/86 |
| 6,981,090 B1 | 12/2005 | Kutz et al. | |
| 6,996,796 B2 | 2/2006 | Sanchez et al. | |
| 7,023,238 B1 | 4/2006 | Camarota | |
| 7,046,035 B2 | 5/2006 | Piasecki et al. | |
| 7,133,945 B2 * | 11/2006 | Lau | 710/104 |
| 7,173,347 B2 | 2/2007 | Tani et al. | |
| 7,266,632 B2 | 9/2007 | Dao et al. | |
| 7,287,112 B1 | 10/2007 | Pleis et al. | |
| 7,299,307 B1 | 11/2007 | Early et al. | |
| 7,308,608 B1 | 12/2007 | Pleis et al. | |
| 7,340,693 B2 | 3/2008 | Martin et al. | |
| 7,360,005 B2 | 4/2008 | Lin | |
| 7,386,740 B2 | 6/2008 | Kutz et al. | |
| 7,436,207 B2 | 10/2008 | Rogers et al. | |
| 7,552,415 B2 | 6/2009 | Sanchez et al. | |
| 7,603,578 B2 | 10/2009 | Balasubramanian et al. | |
| 7,609,178 B2 | 10/2009 | Son et al. | |
| 7,613,943 B2 | 11/2009 | Bakker et al. | |
| 7,737,724 B2 | 6/2010 | Snyder et al. | |
| 7,755,412 B2 * | 7/2010 | Thoma | 327/333 |
| 8,026,739 B2 | 9/2011 | Sullam et al. | |
| 8,179,161 B1 | 5/2012 | Williams et al. | |
| 8,358,150 B1 | 1/2013 | Snyder et al. | |
| 8,441,298 B1 | 5/2013 | Williams et al. | |
| 2002/0118475 A1 | 8/2002 | Ng et al. | |
| 2003/0067919 A1 | 4/2003 | Qiao et al. | |
| 2003/0120977 A1 | 6/2003 | Tang | |
| 2004/0113655 A1 | 6/2004 | Curd et al. | |
| 2004/0141392 A1 | 7/2004 | Lee et al. | |
| 2004/0184601 A1 * | 9/2004 | Kim | 380/1 |
| 2007/0214389 A1 | 9/2007 | Severson et al. | |
| 2008/0258760 A1 | 10/2008 | Sullam et al. | |

OTHER PUBLICATIONS

USPTO Notice of Allowance for U.S. Appl. No. 12/774,680 dated Dec. 21, 2012; 7 pages.

USPTO Notice of Allowance for U.S. Appl. No. 12/902,137 dated Oct. 26, 2012; 10 pages.

USPTO Notice of Allowance for U.S. Appl. No. 13/169,656 dated Jan. 17, 2013; 12 pages.

USPTO Notice of Allowance for U.S. Appl. No. 13/328,385 dated Sep. 23, 2013; 8 pages.

USPTO Notice of Allowance for U.S. Appl. No. 13/328,385 dated Nov. 18, 2013; 7 pages.

USPTO Notice of Allowance for U.S. Appl. No. 13/427,264 dated Jun. 25, 2013; 10 pages.

USPTO Notice of Allowance for U.S. Appl. No. 13/427,264 dated Aug. 21, 2013; 10 pages.

USPTO Notice of Allowance for U.S. Appl. No. 13/893,201 dated Dec. 10, 2013; 10 pages.

USPTO Requirement for Restriction for U.S. Appl. No. 12/753,657 dated Feb. 2, 2011; 5 pages.

USPTO Requirement for Restriction for U.S. Appl. No. 13/893,201 dated Oct. 22, 2013; 6 pages.

"Xilinx Programmer Qualification Specification," 1700E/X Family, Rev. 1.0, Oct. 30, 1997; 16 pages.

U.S. Appl. No. 10/001,478 "In-Circuit Emulator and Pod Synchronized Boot" Craig Nemecek et al., filed Nov. 1, 2001; 44 pages.

U.S. Appl. No. 10/033,027 "Microcontroller Programmable System on a Chip" Warren Snyder et al., filed Oct. 22, 2001; 117 pages.

U.S. Appl. No. 12/773,801 "Debug Through Power Down," Amsby Richardson Jr et al., filed May 4, 2010; 120 pages.

U.S. Appl. No. 12/774,680 "Combined Analog Architecture and Functionality in a Mixed-Signal Array," Kutz et al., filed May 5, 2010; 121 pages.

U.S. Appl. No. 13/893,201 "Bus Sharing Scheme" Timothy J. Williams et al., filed May 13, 2013; 25 pages.

Atmel "Using the Programmable Polarity Control," Application Note, Erasable Programmable Logic Device, 1999, Rev. 0424C-08/99; 7 pages.

David C. Walter, "Verification of Analog and Mixed-Signal Circuits using Symbolic Methods," A Dissertation Submitted to the Faculty of the University of Utah, Aug. 2007; 134 pages.

esc99_Class413 "Rapidly Developing Embedded Systems Using Configurable Processors" dated Dec. 6, 2013; 13 pages.

Faura et al.,"A New Field Programmable System—On-A-Chip for Mixed Signal Integration" dated Dec. 6, 2013; 1 page.

Faura et al.,"FIPSOC: A Field Programmable System on a Chip" dated Dec. 6, 2013; 6 pages.

Faura et al.,"Multicontext Dynamic Reconfiguration" dated Dec. 6, 2013; 11 pages.

Faura et al.,"Programmable Analog Hardware" dated Dec. 6, 2013; 4 pages.

Faura et al.,"Tradeoffs for the Design of Programmable Interconnections" dated Dec. 6, 2013; 5 pages.

Faura et al.,"VHDL Modeling of Fast Dynamic Reconfiguration" dated Dec. 6, 2013; 7 pages.

FP4 Project Synopses-Europe 1996 dated Dec. 6, 2013; 191 pages.

Kundert et al., "Design of Mixed-Signal Systems on Chip," IEEE Transactions on CAD, vol. 19, No. 12, Dec. 2000, pp. 1561-1572; 12 pages.

Lecuyer et al.,"Raise a Detailed Routing Algorithm" dated Dec. 6, 2013; 4 pages.

Moreno et al.,"Feasible Evolutionary and Self Repairing Hardware" dated Dec. 6, 2013; 12 pages.

Moreno et al.,"FIPSOC. A Novel" dated Dec. 6, 2013; 5 pages.

USPTO Advisory Action for U.S. Appl. No. 12/773,801 dated Apr. 25, 2013; 2 pages.

USPTO Advisory Action for U.S. Appl. No. 12/776,323 dated Jan. 8, 2013; 2 pages.

USPTO Final Office Action for U.S. Appl. No. 13/328,962 dated Oct. 2, 2012; 12 pages.

USPTO Final Rejection for U.S. Appl. No. 10/033,027 dated Oct. 31, 2005; 24 pages.

USPTO Final Rejection for U.S. Appl. No. 12/470,274 dated Aug. 30, 2013; 15 pages.

USPTO Final Rejection for U.S. Appl. No. 12/753,657 dated Sep. 22, 2011; 9 pages.

USPTO Final Rejection for U.S. Appl. No. 12/773,801 dated Jan. 23, 2013; 12 pages.

USPTO Final Rejection for U.S. Appl. No. 12/774,680 dated Aug. 3, 2011; 11 pages.

USPTO Non Final Rejection for U.S. Appl. No. 10/033,027 dated Apr. 20, 2005; 20 pages.

USPTO Non Final Rejection for U.S. Appl. No. 10/033,027 dated Oct. 18, 2004; 17 pages.

USPTO Non Final Rejection for U.S. Appl. No. 13/427,264 dated Mar. 19, 2013; 8 pages.

USPTO Non-Final Rejection for U.S. Appl. No. 12/753,657 dated Mar. 18, 2011; 7 pages.

(56) References Cited

OTHER PUBLICATIONS

USPTO Non-Final Rejection for U.S. Appl. No. 12/773,801 dated Jun. 22, 2012; 11 pages.
USPTO Non-Final Rejection for U.S. Appl. No. 12/774,680 dated Feb. 18, 2011; 8 pages.
USPTO Non-Final Rejection for U.S. Appl. No. 12/774,680 dated Jul. 10, 2012; 11 pages.
USPTO Non-Final Rejection for U.S. Appl. No. 12/774,680 dated Dec. 22, 2011; 11 pages.
USPTO Notice of Allowance for U.S. Appl. No. 11/799,439 dated Feb. 5, 2010; 4 pages.
USPTO Notice of Allowance for U.S. Appl. No. 11/799,439 dated Jun. 25, 2009; 6 pages.
USPTO Notice of Allowance for U.S. Appl. No. 12/496,579 dated Jan. 25, 2013; 5 pages.
USPTO Notice of Allowance for U.S. Appl. No. 12/496,579 dated Mar. 5, 2013; 10 pages.
USPTO Notice of Allowance for U.S. Appl. No. 12/496,579 dated Nov. 8, 2012; 7 pages.
USPTO Notice of Allowance for U.S. Appl. No. 12/753,657 dated Mar. 30, 2012; 8 pages.
USPTO Notice of Allowance for U.S. Appl. No. 12/774,680 dated Jan. 31, 2013; 7 pages.
USPTO Notice of Allowance for U.S. Appl. No. 12/774,680 dated Oct. 22, 2012; 7 pages.
USPTO Final Rejection for U.S. Appl. No. 12/773,801 dated Aug. 8, 2014; 14 pages.
USPTO Non-Final Rejection for U.S. Appl. No. 12/773,801 dated Jan. 31, 2014; 14 pages.
USPTO Notice of Allowance for U.S. Appl. No. 12/753,657 dated Nov. 23, 2011; 8 pages.
USPTO Notice of Allowance for U.S. Appl. No. 13/916,386 dated Dec. 12, 2014; 9 pages.

* cited by examiner

PROGRAMMABLE INPUT/OUTPUT CIRCUIT

RELATED APPLICATIONS

This application is a continuation of U.S. patent application Ser. No. 13/427,264, filed Mar. 22, 2012, now U.S. Pat. No. 8,558,578, issued Oct. 15, 2013, which is a continuation of U.S. patent application Ser. No. 12/753,657, filed Apr. 2, 2010, now U.S. Pat. No. 8,179,161, issued May 15, 2012, which claims the benefit of U.S. Provisional Application No. 61/175,586, filed May 5, 2009, U.S. Provisional Application No. 61/175,856, filed May 6, 2009, and U.S. Provisional Application No. 61/176,933, filed May 10, 2009, all of which are incorporated by reference herein in their entirety.

TECHNICAL FIELD

This disclosure relates to the field of integrated circuits and, in particular, to a programmable input/output circuit for an integrated circuit.

BACKGROUND

An input/output (I/O) circuit may be utilized for connection of one circuit, such as a processing system, to another system, device, or component. The processing system may communicate with other external or peripheral devices by sending and receiving various communication signals. These communications are typically routed through an input/output circuit.

Conventional input/output circuits may include standard complementary metal-oxide-semiconductor (CMOS) input buffers, coupled with standard CMOS output buffers. The digital signals received through the input/output circuit swing between 0 volts (V) and the supply voltage Vdd. Thus, the input/output circuit is limited to sending and receiving communication signals that have voltage levels within this range. Certain input/output circuits may include a configurable high level output driver, however, the high output level remains fixed at a single voltage. Conventional input/output circuits do not allow for programming the input path, with a reference voltage generated on-chip, to detect an input signal voltage among various selectable levels. Additionally, the input/output circuits do not allow for coupling a programmable input path with the ability to drive the output signal at various selectable output levels. Furthermore, the input/output circuits do not allow for dynamically enabling the analog and/or digital signal paths to an I/O pad without intervention from the central processing unit (CPU).

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described for a programmable input/output circuit. In one embodiment, the programmable input/output circuit includes a programmable output circuit configured to drive an output signal to an input/output pad at a plurality of voltages. The programmable input/output circuit further includes a programmable input configured to detect an input signal from the input/output pad at a plurality of voltages. The voltage levels of the input and output circuits may be independently and dynamically controllable.

Figure 1:
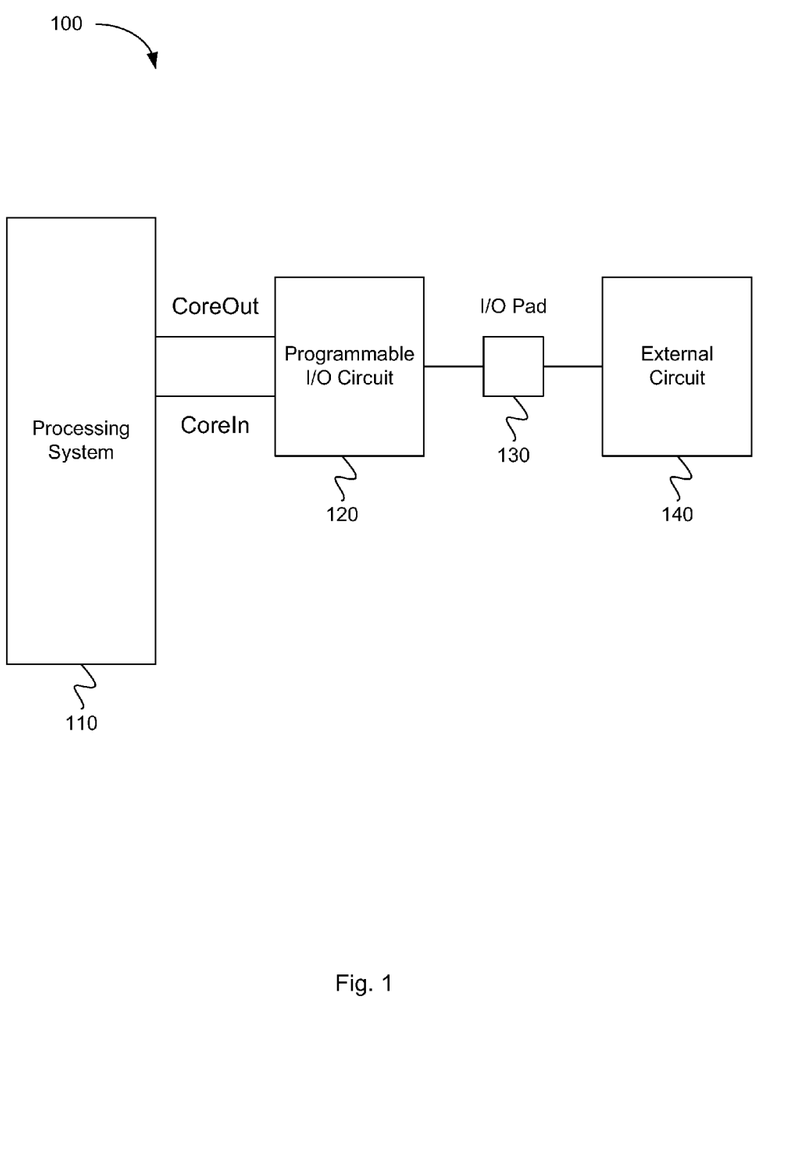
FIG. 1 is a block diagram illustrating a programmable input/output circuit environment according to an embodiment.

FIG. 1 is a block diagram illustrating a programmable input/output circuit environment according to an embodiment of the present invention. In one embodiment, system 100 includes processing system 110, programmable input/output circuit 120, I/O pad 130 and external circuit 140. In one exemplary embodiment, processing system 110 may be the Programmable System on a Chip (PSoC®) processing device, manufactured by Cypress Semiconductor Corporation, San Jose, Calif. One embodiment of a core architecture of processing system 110 is discussed below with respect to FIG. 11. Alternatively, processing system 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing system 110 may be a network processor having multiple processors including a core unit and multiple microengines. Additionally, the processing system 110 may include any combination of general-purpose processing devices and special-purpose processing devices.

Figure 11:
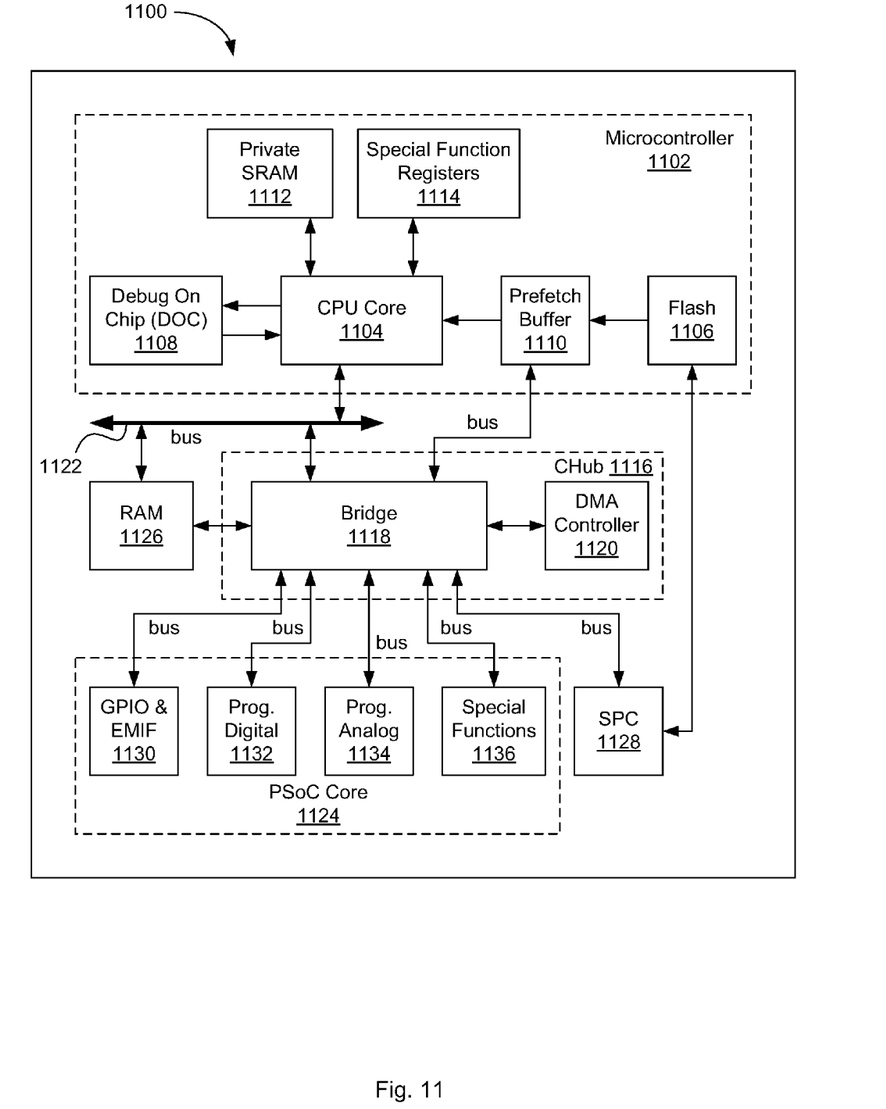
FIG. 11 is a block diagram illustrating a processing device architecture, according to an embodiment

As shown in FIG. 1, programmable input/output circuit 120 is external to processing system 110. In other embodiments, however, programmable input/output circuit 120 may be included on the same chip as processing system 110. Programmable input/output circuit 120, along with I/O pad 130, establish a link between processing system 110 and external circuit 140. Programmable input/output circuit 120 moves signals CoreOut and CoreIn onto and off of processing system 110. Details of the operation of programmable input/output circuit 120 will be provided below. The signals CoreOut and CoreIn represent any output and input signals sent between processing system 110 and external circuit 140. For example, signals the CoreOut and CoreIn may be generated by or directed to CPU core 1104 as shown in FIG. 11. In other embodiments, CoreOut and CoreIn may be sent to/from one or more other components in core architecture 1100 such as DMA controller 1120, programmable digital block 1132, programmable analog block 1134, or other component either shown or not shown. The signals CoreOut or CoreIn may include multiple signals from multiple sources which are time multiplexed and provided over one or more common buses. Connections between programmable input/output circuit 120 and external circuit 140 may be made through I/O pad 130. External circuit 140 is representative of any circuit external to processing system 110 that may communicate with processing system 110. In certain embodiments, external circuit 140 may be a subsystem embodied on the same integrated circuit as processing system 110.

Figure 2:
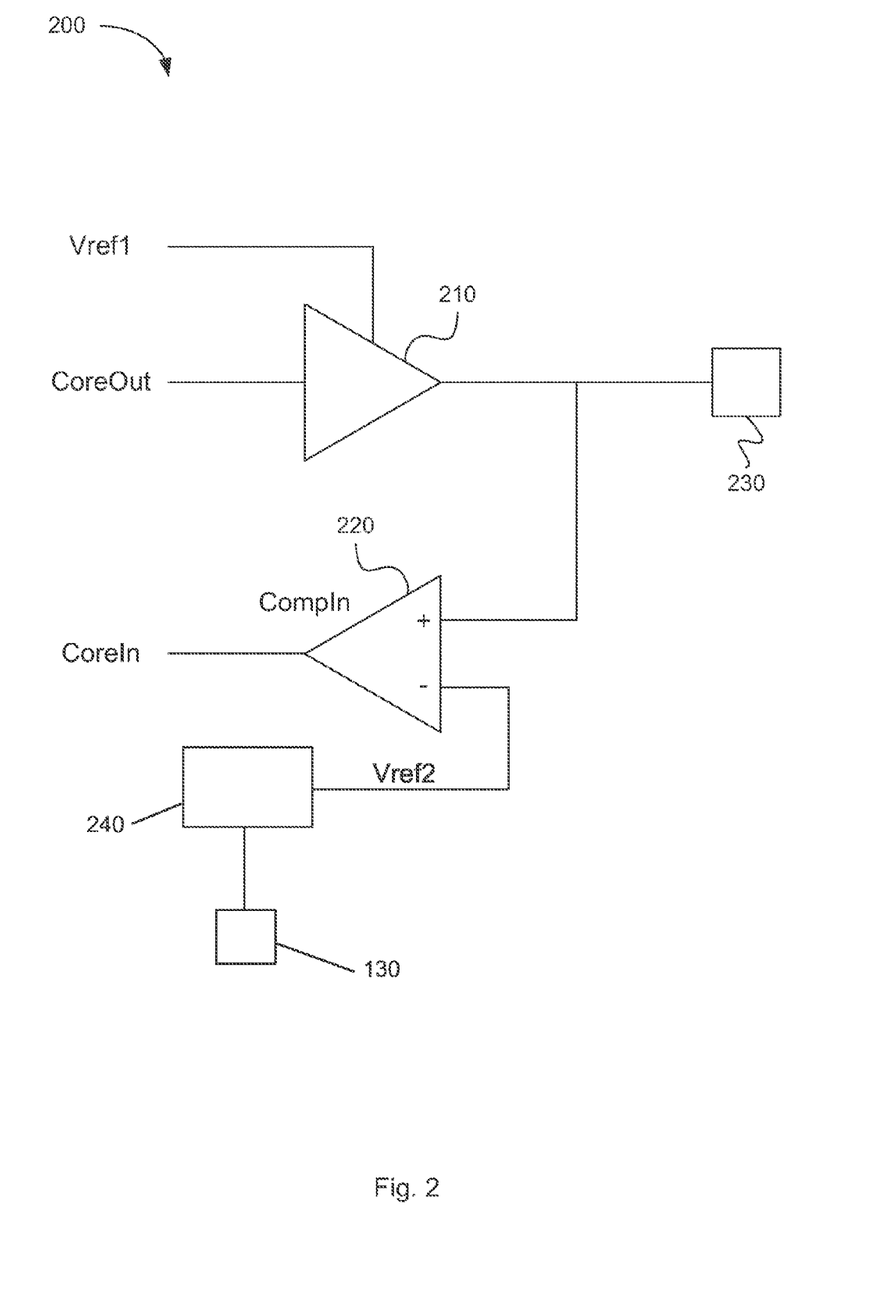
FIG. 2 is a circuit diagram illustrating a programmable input/output circuit according to an embodiment.

FIG. 2 is a circuit diagram illustrating a programmable input/output circuit according to an embodiment of the present invention. Programmable input/output circuit 200 passes input and output signals CoreIn and CoreOut between processing system 110 as shown in FIGS. 1, and I/O pad 230. In one embodiment, the signal CoreOut is received by programmable input/output circuit 200 at output buffer 210. Output buffer 210 may be a single input digital buffer with an adjustable signal Vref1. Output buffer 210 functions as a tri-state output driver. When output buffer 210 is enabled by an enable signal (not shown), the logic level of the signal CoreOut is passed through output buffer 210 to pad 230. Vref1 may be a reference voltage generated by processing system 110 and may be adjustable over a range of voltages, allowing the output high level of output buffer 210 to be programmed to a plurality of selectable voltage levels. When output buffer 210 is not enabled, output buffer 210 has an output in a high impedance state. The high impedance effectively removes output buffer 210, and output signal CoreOut, from the circuit, allowing CoreOut and CoreIn to share the same I/O pad 230.

An input signal may be received by programmable input/output circuit 200 through I/O pad 230 from an external circuit, such as external circuit 140 of FIG. 1. In one embodiment, the input signal is applied to an input of input comparator 220. In one embodiment, input comparator 220 may be an operational amplifier operating in an open loop configuration. The received input signal may be applied to a non-inverting input of the operational amplifier, while a second reference voltage Vref2 is applied to the inverting input. In other embodiments, the received input signal may be applied to the inverting input while the second reference voltage Vref2 is applied to the non-inverting input. The high gain of the operational amplifier causes input comparator 220 to output the highest voltage it can if the voltage level of the signal at the non-inverting input is greater than that of the inverting input. Thus, if the voltage of the input signal received at I/O pad 230 is greater than the reference voltage Vref2, CoreIn will be passed as a high logic level from the output of input comparator 220 and applied to processing system 110, as shown in FIG. 1. If the voltage at pad 230 is less than Vref2, CoreIn will be passed as a low logic level.

The reference voltages Vref1 and Vref2 may be received from a number of places, depending on the embodiment. In one embodiment, Vref1 and Vref2 are generated by processing system 110. In another embodiment, Vref1 and Vref2 may be supplied by an external circuit, such as external circuit 140 of FIG. 1 via I/O pad 130. In yet another embodiment, Vref1 and Vref2 may be generated by different circuits, such as circuit 240. In one embodiment, Vref1 and Vref2 may be user-selectable reference voltages. The values of Vref1 and Vref2 may be set in response to user-input received by processing system 110. The values of Vref1 and Vref2 may be set, for example, by inputting or selecting a value from a register. In one embodiment, Vref2 may have a value of approximately one half of the expected signal voltage range at I/O pad 230. For example, if an input signal has an expected voltage swing of 1 volt (V) (i.e., from 0 V to 1 V), then Vref2 may have a voltage level of 0.5 V. Thus, if the voltage level of the input signal at I/O pad 230 is greater than halfway between 0 V and the expected 1 V (i.e., 0.5 V), CoreOut will have a high logic output value. Vref2 may be programmable, however, so that the input threshold can be selected from any number of voltage levels in other embodiments.

Figure 3:
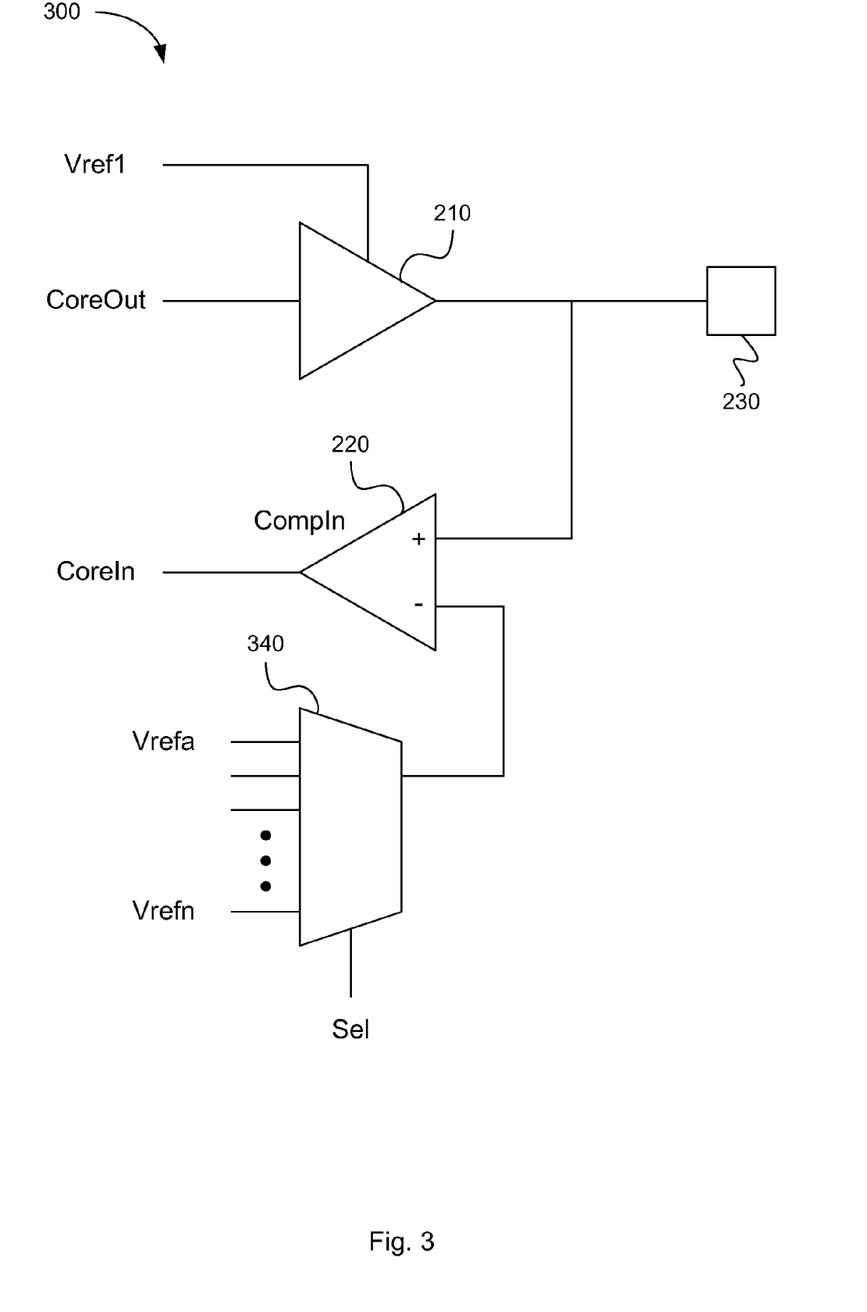
FIG. 3 is a circuit diagram illustrating a programmable input/output circuit according to an embodiment.

FIG. 3 is a circuit diagram illustrating a programmable input/output circuit according to an embodiment of the present invention. Programmable input/output circuit 300 passes input and output signals CoreIn and CoreOut between processing system 110 as shown in FIGS. 1, and I/O pad 230. In one embodiment, the signal CoreOut is received by programmable input/output circuit 300 at output buffer 210. Output buffer 210 may be a single input digital buffer with an enable signal (not shown) and an adjustable signal Vref1, as discussed above with respect to FIG. 2.

An input signal may be received by programmable input/output circuit 300 through I/O pad 230 from an external circuit, such as external circuit 140 of FIG. 1. In one embodiment, the input signal is applied to a non-inverting input of input comparator 220. In one embodiment, input comparator 220 may be an operational amplifier operating in an open loop configuration, as discussed above with respect to FIG. 2.

In one embodiment, the signal applied to an inverting input of input comparator 220 may be selected from among a plurality of reference voltages Vrefa-Vrefn. One reference voltage may be selected from the plurality of reference voltages to be applied to input comparator 220 using a selection circuit 340. In one embodiment selection circuit 340 may be a multiplexer. Multiplexer 340 may receive reference voltages Vrefa-Vrefn as inputs and output the selected reference voltage to the inverting input of input comparator 220. In one embodiment, reference voltages Vrefa-Vrefn are received from processing system 110, however in other embodiments, the reference voltages may be received from some other circuit. In other embodiments, there may be any number of reference voltages applied as inputs to multiplexer 340. The plurality of reference voltages available to multiplexer 340 allow input/output circuit 300 to dynamically switch from a first reference voltage to a second reference voltage should the need arise. For example, multiple external circuits may supply input signals of varying voltage levels to I/O pad 230. In one embodiment, input/output circuit 300 may dynamically switch the reference voltages accordingly without interrupting operation of the system.

The output of multiplexer 340 may be controlled by a selection signal Sel. In one embodiment, selection signal Sel is received from processing system 110. Selection signal Sel may be generated within processing system 110 by a CPU, by a direct memory access (DMA) transfer into a register, by a programmable or fixed function digital circuit, or by some other signal generation means. In other embodiment, selection signal Sel is received from an external circuit, such as external circuit 140. As discussed above, if the voltage level of the input signal at I/O pad 230 is greater than the reference voltage selected from the plurality of reference voltages Vrefa-Vrefn by selection signal Se1, the signal CoreIn will be passed as a high logic level from the input comparator 220 to processing system 110, as shown in FIG. 1. If the voltage level at pad 230 is less than the selected reference voltage, CoreIn will be passed as a low logic level.

Figure 4:
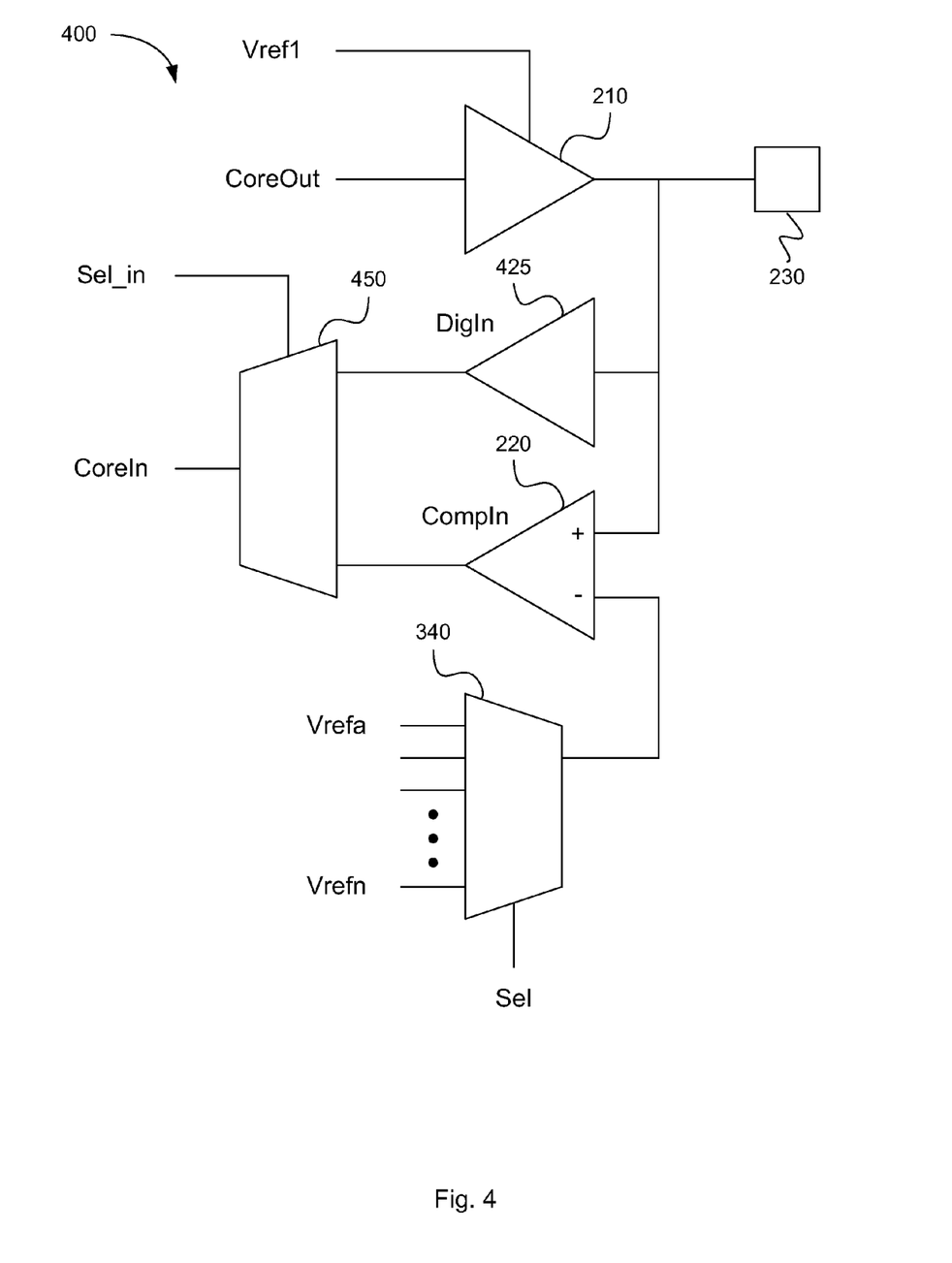
FIG. 4 is a circuit diagram illustrating a programmable input/output circuit according to an embodiment.

FIG. 4 is a circuit diagram illustrating a programmable input/output circuit according to an embodiment according to an embodiment. Programmable input/output circuit 400 passes input and output signals CoreIn and CoreOut between processing system 110 as shown in FIG. 1, and I/O pad 230. In one embodiment, the signal CoreOut is received by programmable input/output circuit 400 at output buffer 210. Output buffer 210 may be a single input digital buffer with an enable signal (not shown) and an adjustable signal Vref1, as discussed above with respect to FIG. 2.

An input signal may be received by programmable input/output circuit 400 through I/O pad 230 from an external circuit, such as external circuit 140 of FIG. 1. In one embodiment, the input signal is applied to a non-inverting input of input comparator 220. In one embodiment, input comparator 220 may be an operational amplifier operating in an open loop configuration, as discussed above with respect to FIG. 2. The input signal received at I/O pad 230 may be compared to a reference voltage by input comparator 220. In one embodiment, the reference voltage may be a fixed reference voltage Vref2, as shown in FIG. 2. In another embodiment, the reference voltage may be selected from a plurality of reference voltages Vrefa-Vrefn by a selection circuit 340 as discussed above with respect to FIG. 3.

In one embodiment, programmable input/output circuit 400 also includes input buffer 425. Input buffer 425 may be a single input digital buffer which receives the input signal from I/O pad 230. The signal CoreIn may be selected from either the output of input buffer 425 or the output of input comparator 220. In one embodiment a selection circuit 450 is used to select the signal for CoreIn. Selection circuit 450 may be a multiplexer controlled by selection signal Se1_in, and configured to receive the outputs of input buffer 425 and input comparator 220 as inputs. Depending on the state of selection signal Se1_in, one of these signals is selected to be output as CoreIn and applied to processing system 110. In one embodiment selection signal Se1_in is received from the same circuit as the selection signal Se1 applied to multiplexer 340. In other embodiments, however, selection signal Se1_in may be received from some other logic circuit. For example, Se1_in may be controlled by a user or by the connected external circuitry. The user may use selection signal Se1_in to decide between using the adjustable precision offered by input comparator 220 and the potential power savings of input buffer 425 depending on the particular application or connected circuit.

Figure 5:
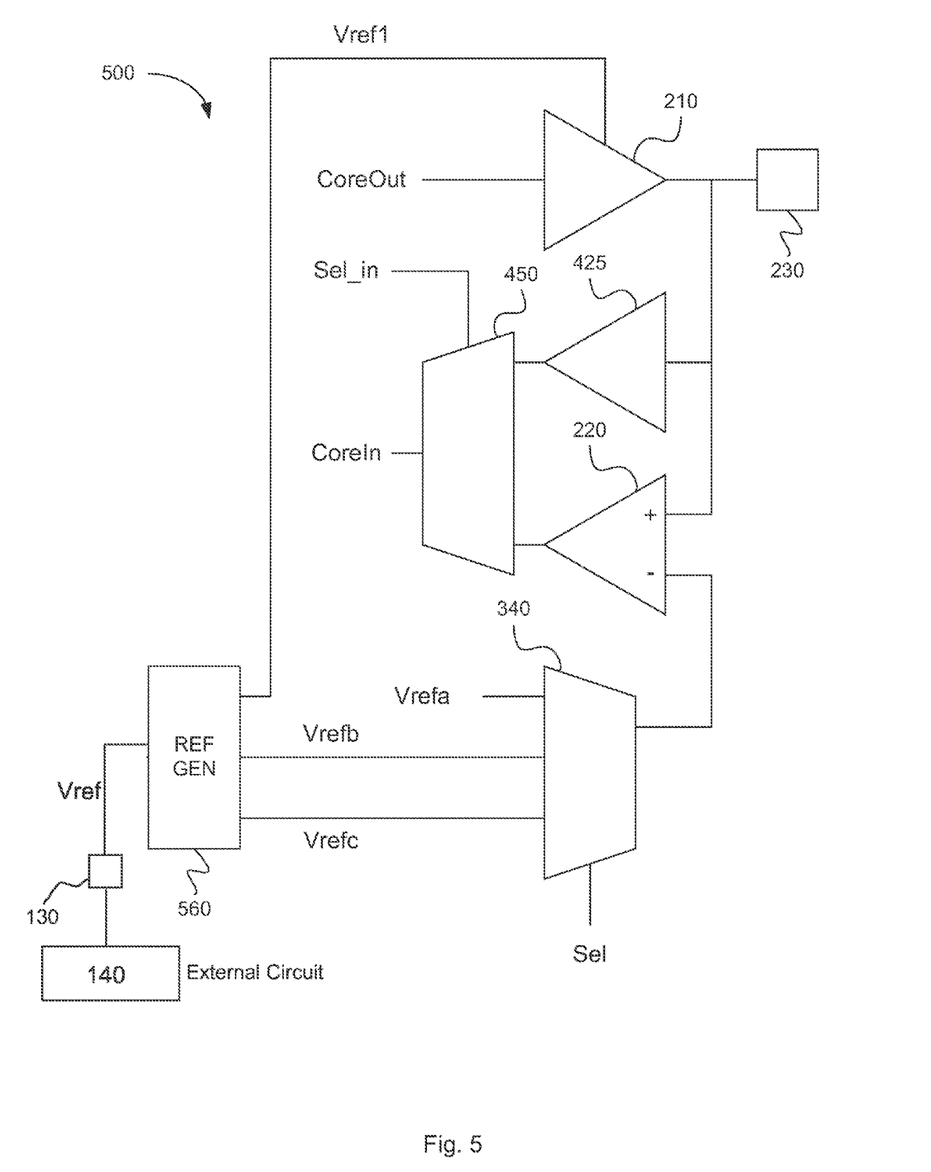
FIG. 5 is a circuit diagram illustrating a programmable input/output circuit according to an embodiment.

FIG. 5 is a circuit diagram illustrating a programmable input/output circuit according to an embodiment of the present invention. Programmable input/output circuit 500 passes input and output signals CoreIn and CoreOut between processing system 110 as shown in FIGS. 1, and I/O pad 230. In one embodiment, programmable input/output circuit 500 includes output buffer 210, input buffer 425 and input comparator 220, as discussed above with respect to FIG. 4. Programmable input/output circuit 500 may also include reference generator circuit 560.

In one embodiment, reference generator circuit 560 provides reference voltage Vref1 as the enable signal for output buffer 210 as well as one or more reference voltages Vrefb, Vrefc as inputs to multiplexer 340. In one embodiment, there may be a selector circuit (not shown) similar to multiplexer 340 to select between one or more reference voltages (e.g., Vref1) to be applied to output buffer 210 as the enable signal. Reference generator circuit 560 may receive a base reference voltage Vref from an external circuit 140 via I/O pad 130, and through a circuit, such as for example a resistor divider, generate the additional reference voltages Vref1, Vrefb, Vrefc. Since these reference voltages are all provided by reference generator circuit 560, there may be a relationship between them. For example, Vrefb may be one half the value of Vref1 and Vrefc may be one half the value of Vrefb. In other embodiments, there may be some other relationship between the reference voltages.

Figure 6:
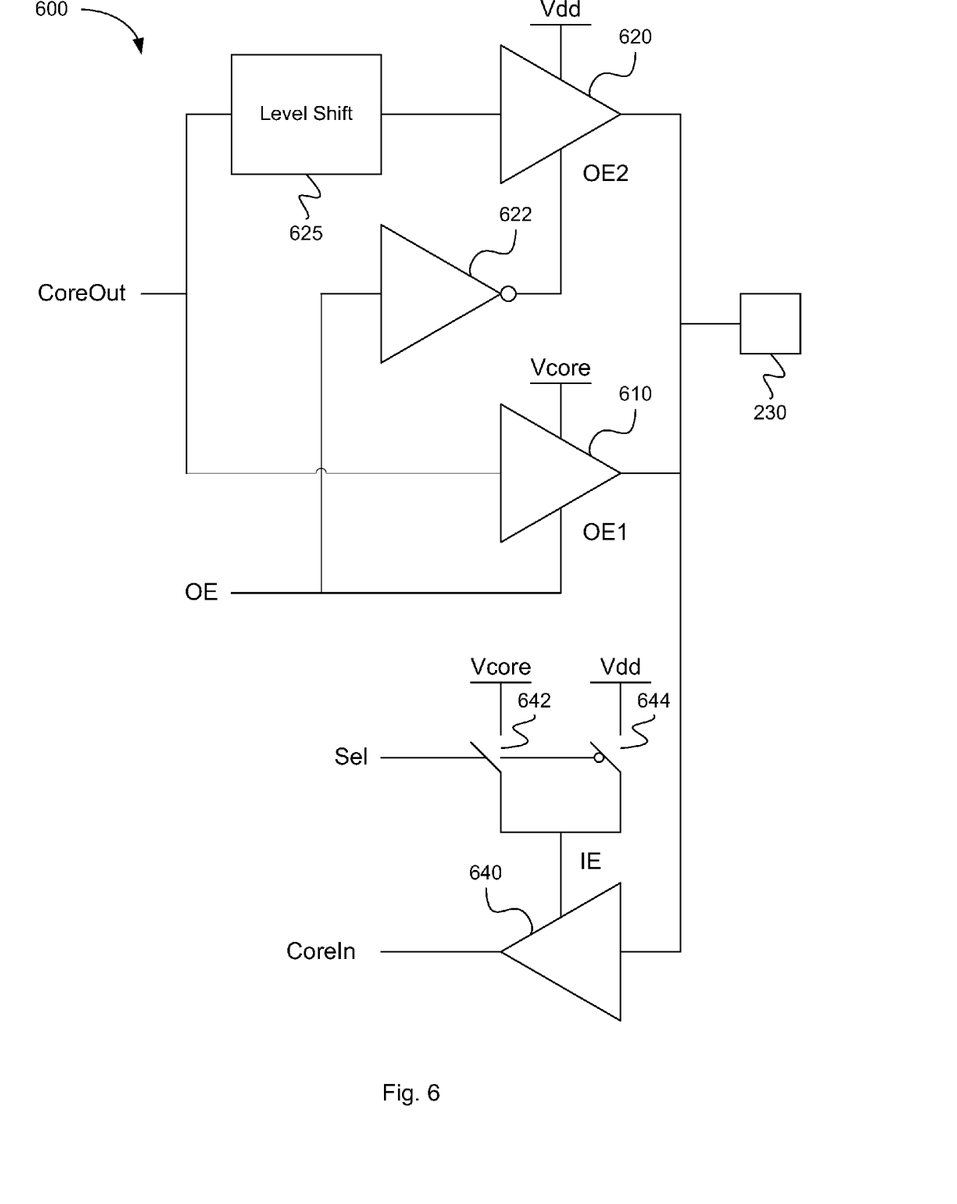
FIG. 6 is a circuit diagram illustrating a programmable input/output circuit according to an embodiment.

FIG. 6 is a circuit diagram illustrating a programmable input/output circuit according to an embodiment of the present invention. Programmable input/output circuit 600 passes input and output signals CoreIn and CoreOut between processing system 110 as shown in FIGS. 1, and I/O pad 230. In one embodiment, the signal CoreOut is received by programmable input/output circuit 600 at output buffers 610 and 620. Output buffers 610 and 620 may be single input digital buffers controlled by output enable signal OE. In one embodiment, output buffer 620 is powered by supply voltage Vdd and output buffer 610 is powered by supply voltage Vcore. The supply voltages may be received from processing system 110, where Vdd is, for example, the main supply voltage and Vcore is an internally regulated supply voltage.

Output enable signal OE may be a digital signal received from processing system 110, which alternately enables output buffers 610 and 620. In one embodiment, for example, output enable signal OE may be directly applied to the first output buffer 610 as enable signal OE1, while OE is inverted before being applied to the second output buffer 620 as OE2. Output enable signal OE may be inverted by inverter 622. This allows output buffer 610 to be enabled while output buffer 620 is disabled, and output buffer 610 to be disabled while output buffer 620 is enabled. In an alternative embodiment, output enable signal may be applied directly to output buffer 620 and inverted before being applied to input buffer 610. In another embodiment, the output enable signal OE may be disabled causing neither output buffer 610 nor output buffer 620 to be enabled. When neither output buffer is enabled, both output buffers 610 and 620 may have an output in a high impedance state.

In one embodiment, output signal CoreOut is applied to level shifting circuit 625 before it reaches output buffer 620. CoreOut may be at the approximate voltage level of the core Vcore of processing system 110. In order to have the output buffer 620 function properly without leakage, level shifting circuit 625 shifts the voltage level of CoreOut from Vcore to Vdd. In one embodiment, Vdd may be approximately 5 V and Vcore may be approximately 1.8 V, however, in other embodiments, the supply voltages may have other values. In other embodiments, CoreOut may be applied to a level shifting circuit before it reaches output buffer 610, or may be applied to a level shifting circuit before it reaches both output buffer 610 and output buffer 620. Level shifters, such as level shifting circuit 625, are well known in the art and accordingly are not described here so as not to obscure the present invention.

An input signal may be received by programmable input/output circuit 600 through I/O pad 230 from an external circuit, such as external circuit 140 of FIG. 1. In one embodiment, the input signal is applied to input buffer 640. Input buffer 640 may be a single input digital buffer which receives the input signal from I/O pad 230. Input buffer 640 may have an enable signal IE that is selected from a number of voltages, such as Vdd and Vcore. Enable signal IE may be alternately switched between Vcore and Vdd by switches 642 and 644. Switches 642 and 644 may be controlled by select signal Se1. Thus, through select signal Se1, input buffer 640 may be programmed according to the voltage level of the input signal received at I/O pad 230.

In another embodiment, input/output circuit 600 may include input comparator 220 and/or input buffer 425 as shown in FIG. 2, 3, 4 or 5. In yet another embodiment, input/output circuit 600 may include output buffer 210 as shown in FIG. 2, 3, 4 or 5.

Figure 7:
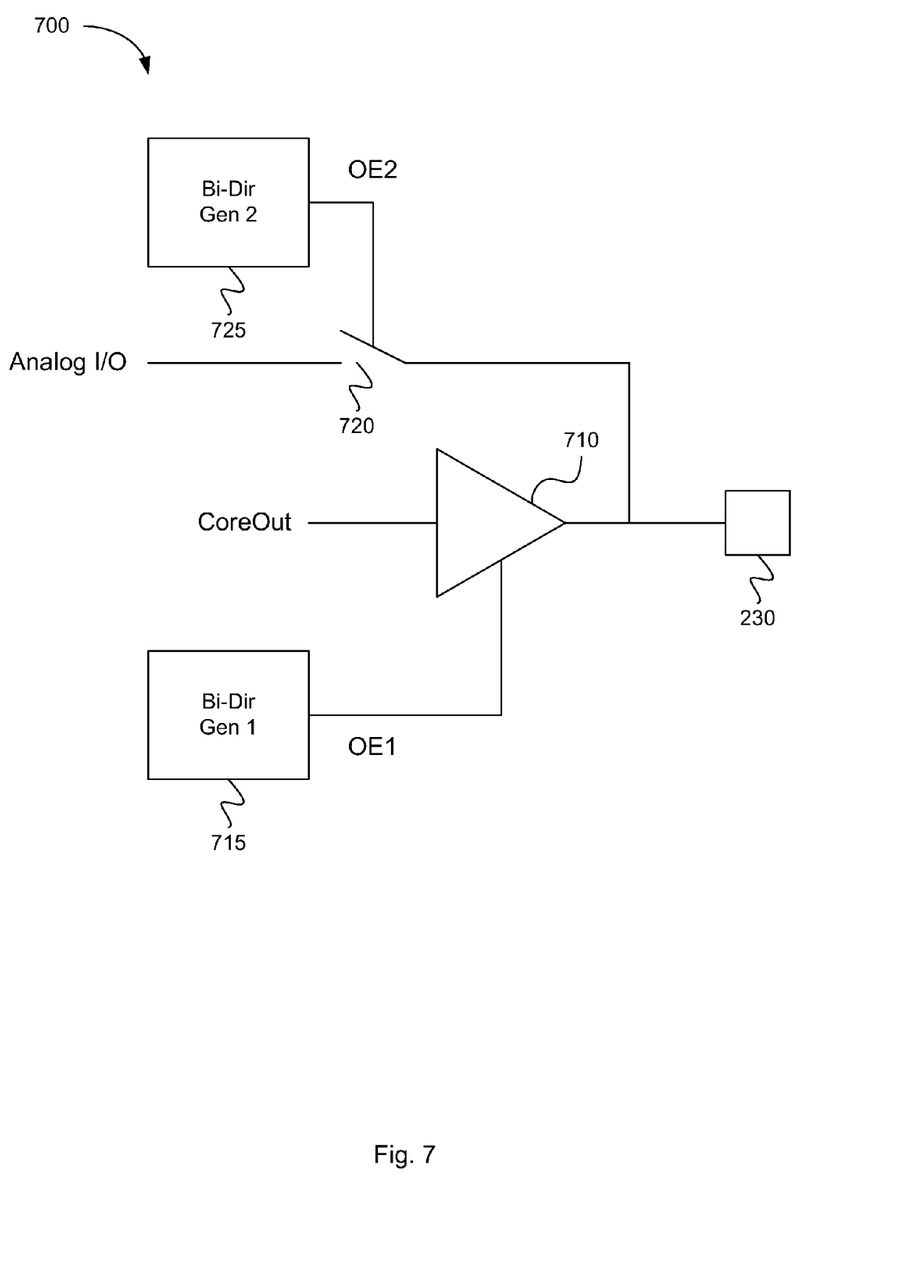
FIG. 7 is a circuit diagram illustrating a programmable input/output circuit according to an embodiment.

FIG. 7 is a circuit diagram illustrating a programmable input/output circuit according to an embodiment of the present invention. Programmable input/output circuit 700 passes input and output signals Analog I/O and CoreOut between processing system 110 as shown in FIGS. 1, and I/O pad 230. In one embodiment, the signal CoreOut is received by programmable input/output circuit 700 at output buffer 710. Output buffer 710 may be a single input digital buffer with an enable signal OE1. Output buffer 710 functions as a switch, such that when the enable signal OE1 is applied to output buffer 710, the logic level of the signal CoreOut is passed through output buffer 710 to pad 230. In one embodiment enable signal OE1 may be generated by bidirectional generator 715.

An analog I/O signal may be coupled between I/O pad 230 and processing system 110 through switch 720. In one embodiment, switch 720 is controlled by enable signal OE2, which may be generated by bidirectional generator 725. In another embodiment, OE1 and OE2 may be generated by the same signal generator and may be inverse of each other in order to alternately drive the I/O pad 230 with CoreOut through output buffer 710 and apply the analog voltage signal at I/O pad 230 to processing system 110 or other circuitry as Analog I/O. In another embodiment, OE1 and OE2 may be adjusted to be overlapping or non-overlapping as needed for proper functionality. In other embodiments, one or both of OE1 and OE2 may be generated by the CPU of processing device 110, a DMA transfer to a register, by a programmable or fixed function digital circuit, or by some other signal generation means.

Figure 8:
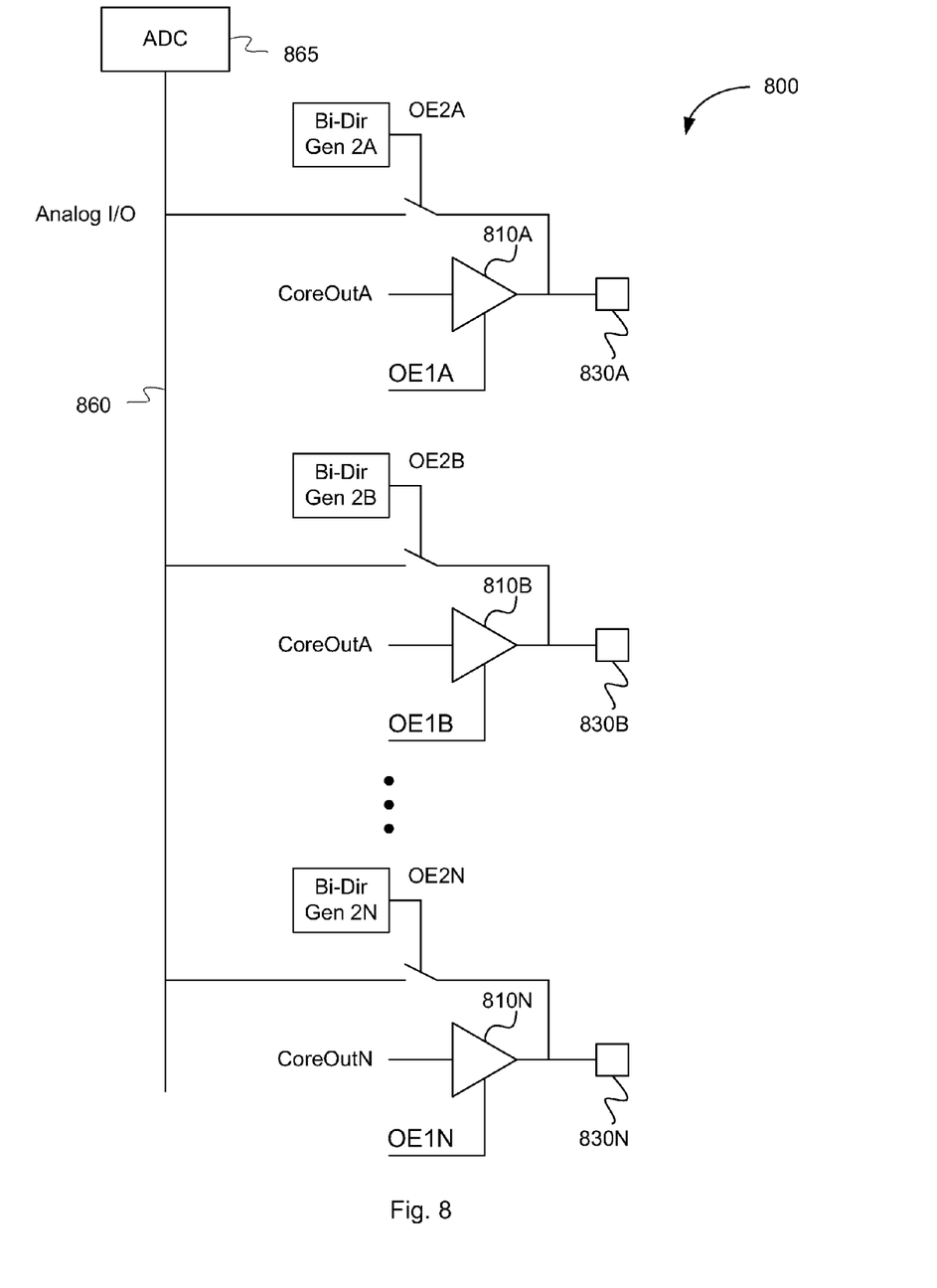
FIG. 8 is a circuit diagram illustrating a programmable input/output circuit according to an embodiment.

FIG. 8 is a circuit diagram illustrating a programmable input/output circuit according to an embodiment of the present invention. Programmable input/output circuit 800 passes input and output signals Analog I/O and CoreOut between processing system 110 as shown in FIGS. 1, and I/O pads 830A-830N. In one embodiment programmable input/output circuit 800 includes a number of circuits similar to programmable input/output circuit 700 of FIG. 7. In one embodiment, enable signals OE1A-OE1N are disabled, causing output buffers 810A-810N to be in a high impedance state.

Enable signals OE2A-OE2N may be successively applied to switches in the Analog I/O line to measure the voltages at I/O Pads 830A-830N. In one embodiment each of enable signals OE2A-OE2N may be generated by bi-directional generators 2A2N. The Analog I/O lines coupled to each I/O pad 830A-830N may be connected to a common internal analog net 860. The analog net 860 may route to a function such as analog-to-digital converter (ADC) 865, or other fixed function or programmable analog circuit, for signal processing of the I/O pad voltages without direct interaction with a central processing unit (CPU) of processing system 110. In one embodiment, a subset of all I/O pad voltages in circuit 800 are measured. Analog net 860, may be for example, a single wire, or may include one or more multiplexers having a complex hierarchy.

Figure 9:
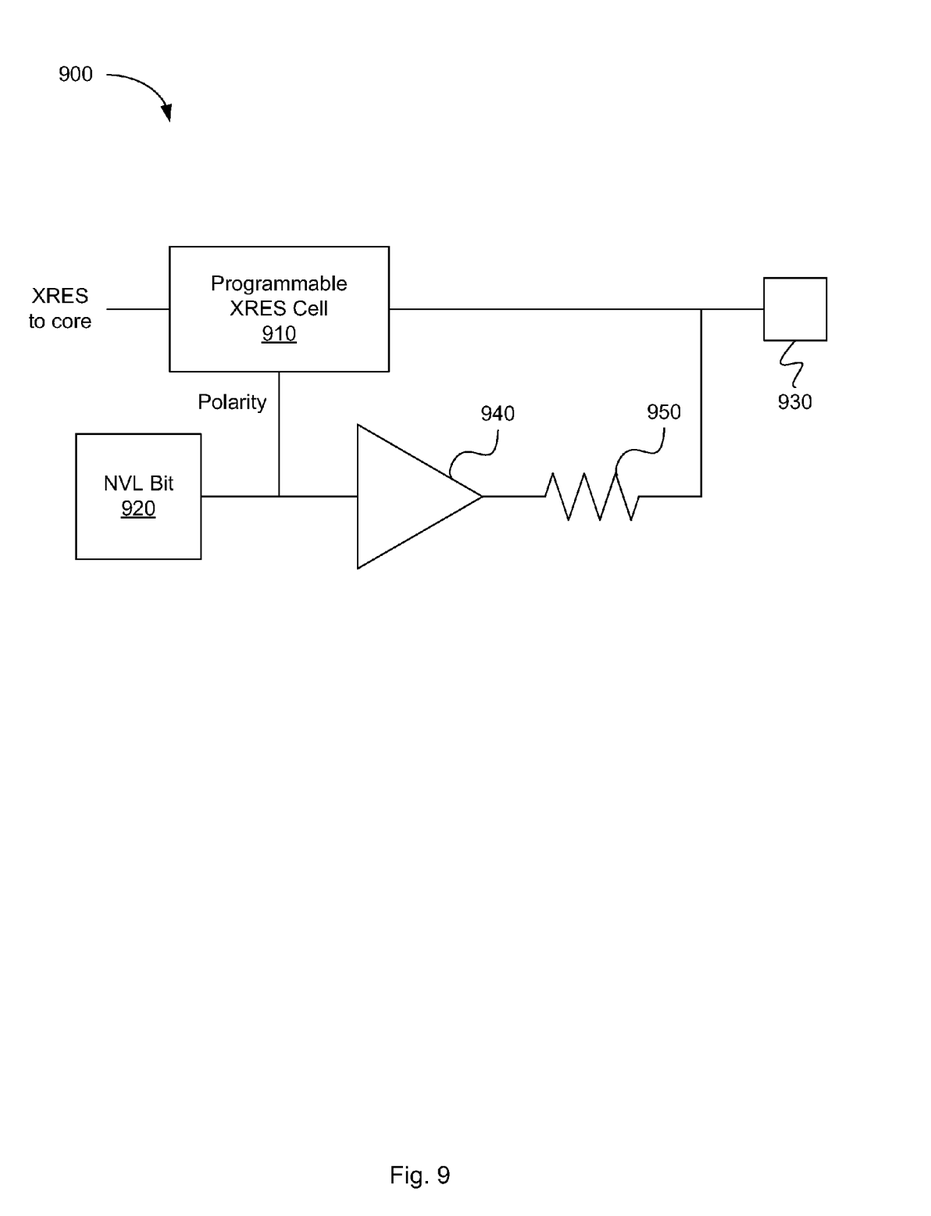
FIG. 9 is a circuit diagram illustrating a programmable reset polarity circuit according to an embodiment.

FIG. 9 is a circuit diagram illustrating a programmable reset polarity circuit according to an embodiment of the present invention. Programmable reset polarity circuit 900 may include programmable external reset (XRES) cell 910 to optionally provide either positive or negative polarity for a reset signal received at I/O pad 930. In one embodiment, the desired state of the reset polarity (i.e., either positive or negative) is stored in non-volatile memory element 920, such as a non-volatile latch (NVL) bit or a fuse. Programmable XRES cell 910 may include an input buffer that receives the logic level of the reset signal at I/O pad 930 and returns a high XRES signal to the device core when the reset signal is above or below the reset threshold, depending on the chosen polarity. The received Polarity signal from NVL bit 920 causes programmable XRES cell 910 to invert the output if necessary for the chosen polarity. For example for positive polarity, programmable XRES cell 910 may output a logic high XRES signal when the received reset signal is high and may output a logic low XRES signal when the received reset signal is low. For negative polarity, programmable XRES cell 910 may output a logic high XRES signal when the received reset signal is low and may output a logic low XRES signal when the received reset signal is high. In addition, the Polarity signal may adjust the threshold for detecting a reset signal. In one embodiment, for positive polarity, the threshold may be set at one-third of the voltage supply, while for negative polarity, the threshold may be set at two-thirds of the voltage supply. In other embodiments, the threshold may be set at any other value.

If the I/O pad 930 is not driven externally or, alternatively, is driven with only a weak external signal, buffer 940 and resistor 950 may be used to drive I/O pad 930 to a voltage that does not assert the XRES signal. This may help to prevent causing an unwanted reset signal in an environment where electronic noise is prevalent. When NVL bit 920 is programmed to provide a positive polarity reset, buffer 940 may drive a low signal to I/O pad 930 to prevent a reset. I/O pad 930 may be driven with a stronger signal than resistor 950 in order to assert a reset on the XRES signal.

Figure 10:
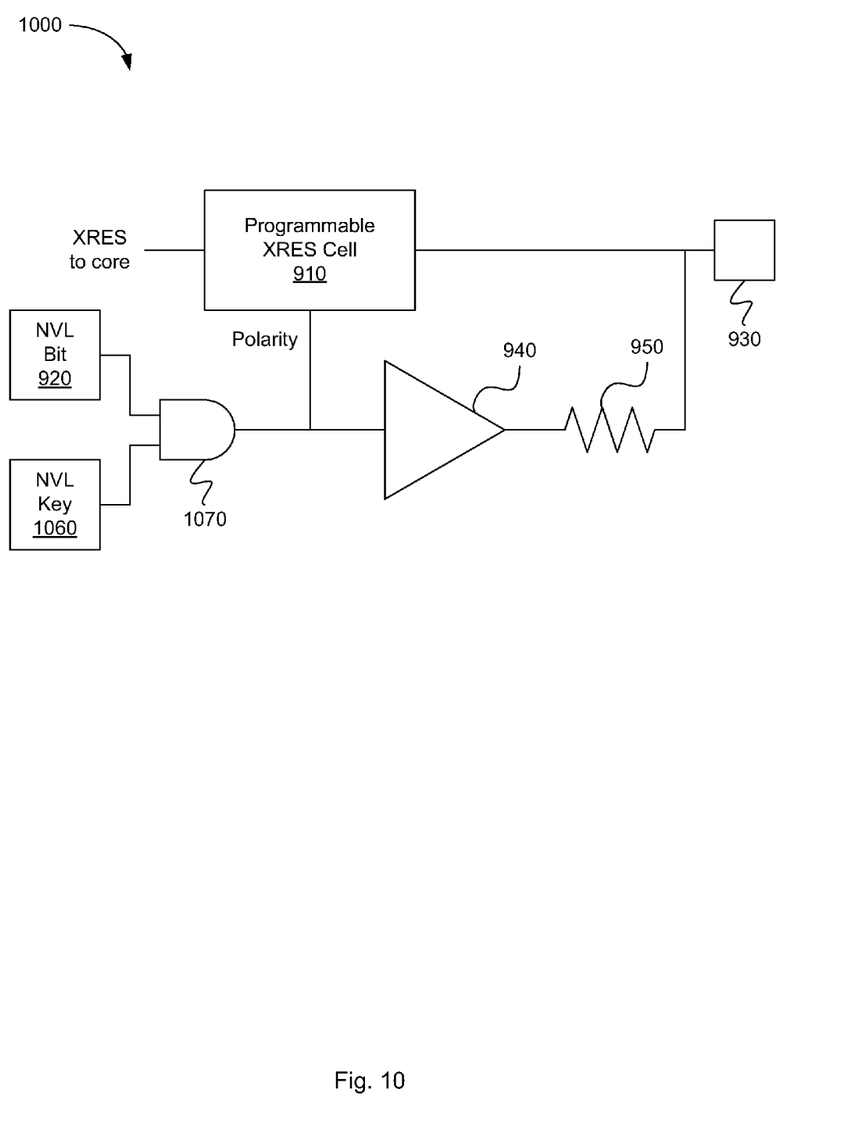
FIG. 10 is a circuit diagram illustrating a programmable reset polarity circuit according to an embodiment.

FIG. 10 is a circuit diagram illustrating a programmable reset polarity circuit according to an embodiment of the present invention. Programmable reset polarity circuit 1000 may be similar to circuit 900 shown in FIG. 9. In circuit 900, because the NVL bit may be undefined or unknown when the device is first tested, there may be a delay or a low yield if the device has the unexpected polarity. Programmable reset polarity circuit 1000 prevents this by making the control field somewhat larger, such as by using a bit 920 for the reset polarity state and several other bits as a key 1060. When NVL key 1060 is in the proper state, the polarity bit state can be considered, otherwise it is ignored and the device is configured with the default reset polarity. In one embodiment, NVL key 1060 includes 7 bits which is applied to AND gate 1070 along with NVL bit 920 to define the reset polarity signal Polarity.

FIG. 11 illustrates an embodiment of a core architecture 1100 of the Programmable System-on-Chip (PSoC®), such as that used in the PSoC3 family of products offered by Cypress Semiconductor Corporation (San Jose, Calif.). In one embodiment, the core architecture 1100 may represent processing system 110 as discussed above. In one embodiment, the core architecture 1100 includes a microcontroller 1102. The microcontroller 1102 includes a CPU (central processing unit) core 1104, flash program storage 1106, DOC (debug on chip) 1108, a prefetch buffer 1110, a private SRAM (static random access memory) 1112, and special functions registers 1114. In an embodiment, the DOC 1108, prefetch buffer 1110, private SRAM 1112, and special function registers 1114 are coupled to the CPU core 1104, while the flash program storage 1106 is coupled to the prefetch buffer 1110.

The core architecture 1100 may also include a CHub (core hub) 1116, including a bridge 1118 and a DMA (direct memory access) controller 1120, that is coupled to the microcontroller 1102 via bus 1122. The CHub 1116 may provide the primary data and control interface between the microcontroller 1102 and its peripherals and memory, and a programmable core 1124. The DMA controller 1120 may be programmed to transfer data between system elements without burdening the CPU core 1104. In various embodiments, each of these subcomponents of the microcontroller 1102 and CHub 1116 may be different with each choice or type of CPU core 1104. The Chub 1116 may also be coupled to shared SRAM 1126 and an SPC (system performance controller) 1128. The private SRAM 1112 is independent of the shared SRAM 1126 that is accessed by the microcontroller 1102 through the bridge 1118. The CPU core 1104 accesses the private SRAM 1112 without going through the bridge 1118, thus allowing local register and RAM accesses to occur simultaneously with DMA access to shared SRAM 1126. Although labeled here as SRAM, these memory modules may be any suitable type of a wide variety of (volatile or non-volatile) memory or data storage modules in various other embodiments.

In various embodiments, the programmable core 1124 may include various combinations of subcomponents (not shown), including, but not limited to, a digital logic array, digital peripherals, analog processing channels, global routing analog peripherals, DMA controller(s), SRAM and other appropriate types of data storage, TO ports, and other suitable types of subcomponents. In one embodiment, the programmable core 1124 includes a GPIO (general purpose IO) and EMIF (extended memory interface) block 1130 to provide a mechanism to extend the external off-chip access of the microcontroller 1102, a programmable digital block 1132, a programmable analog block 1134, and a special functions block 1136, each configured to implement one or more of the subcomponent functions. In various embodiments, the special functions block 1136 may include dedicated (non-programmable) functional blocks and/or include one or more interfaces to dedicated functional blocks, such as USB, a crystal oscillator drive, JTAG, and the like.

The programmable digital block 1132 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 1132 may be configured to perform various digital functions, including, but not limited to, one or more of the following functions: a basic 12C slave; an 12C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an 12C slave that supports hardware address detection and the ability to handle a complete transaction without CPU core (e.g., CPU core 1104) intervention and to help prevent the force clock stretching on any bit in the data stream; an 12C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an 12S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 1134 may include analog resources including, but not limited to, comparators, mixers, PGAs (programmable gain amplifiers), TIAs (trans-impedance amplifiers), ADCs (analog-to-digital converters), DACs (digitalto-analog converters), voltage references, current sources, sample and hold circuits, and any other suitable type of analog resources. The programmable analog block 1134 may support various analog functions including, but not limited to, analog routing, LCD drive TO support, capacitive sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. An apparatus comprising:
    a processing system;
    a first input buffer coupled to the processing system and a first input/output (I/O) pad; and
    a first reference generator coupled to the first input buffer and a second I/O pad, the first reference generator to control the input threshold of the first input buffer in response to an analog voltage received on the second I/O pad from an external circuit.

2. The apparatus of claim 1 further comprising:
    a second reference generator; and
    a selection circuit to selectively couple the first and second reference generators with the first input buffer.

3. The apparatus of claim 2 wherein the second reference generator provides a reference voltage approximately equal to a core supply voltage.

4. The apparatus of claim 1 wherein the input threshold of the first input buffer is equal to approximately half the analog voltage received on the first I/O pad.

5. The apparatus of claim 1 wherein the first input buffer is to provide a digital input signal to the processing system in response to an input voltage on the first I/O pad and an analog voltage on the second I/O pad.

6. The apparatus of claim 5 wherein the digital input signal has a first logic value when the input voltage on the first I/O pad is greater than the reference voltage and a second voltage value when the input voltage on the first I/O pad is less than the reference voltage.

7. The apparatus of claim 1 further comprising a second input buffer coupled between the second I/O pad and the processing system.

8. The apparatus of claim 7 further comprising a third input buffer coupled between the first I/O pad and the processing system.

9. The apparatus of claim 8 wherein the second and third input buffers are digital input buffers.

10. The apparatus of claim 1 further comprising an output buffer coupled between the processing system and the first I/O pad.

11. A method comprising:
    receiving by a first input buffer an input signal from a first I/O pad and a first reference signal generated by a first reference generator in response to an analog voltage on a second I/O pad; and
    outputting a signal from the first input buffer to a processing system in response to the input signal and the first reference signal.

12. The method of claim 11 further comprising selectively coupling to the first input buffer with one of the first reference signal and a second reference signal generated by a second reference generator.

13. The method of claim 11 further comprising dynamically changing an input threshold of the first input buffer by changing the selection of a reference signal provided to the first input buffer from the first reference signal to the second reference signal.

14. The method of claim 11 wherein the outputting of the signal from the first input buffer to the processing system comprises outputting a digital signal.

15. The method of claim 14 further comprising outputting the digital signal with a first digital logic value when the voltage received from the first I/O pad is greater than the first reference signal and with a second digital logic value when the voltage received from the first I/O pad is less than the first reference signal.

16. The method of claim 11 further comprising receiving by a second input buffer a second input signal from the second I/O pad.

17. The method of claim 16 further comprising receiving by a third input buffer a third input signal from the first I/O pad.

18. A system comprising:
    an external circuit coupled to first and second I/O pads;
    a processing system;
    a first input buffer coupled to the processing system and the first I/O pad; and
    a first reference generator coupled to the first input buffer and the second I/O pad, the first reference generator to control the input threshold of the first input buffer in response to an analog voltage received on the second I/O pad from an external circuit.

19. The system of claim 18 further comprising a second reference generator and a selection circuit to selectively couple the first and second reference generators to the first input buffer.

20. The system of claim 18 further comprising a second input buffer coupled between the second I/O pad and the processing system and a third input buffer coupled between the first I/O pad and the processing system.

* * * * *